United States Patent
Inoue et al.

(10) Patent No.: US 11,677,053 B2
(45) Date of Patent: Jun. 13, 2023

(54) METHOD OF MANUFACTURING LIGHT EMITTING ELEMENT

(71) Applicant: NICHIA CORPORATION, Anan (JP)

(72) Inventors: Yoshiki Inoue, Anan (JP); Naoto Furuha, Kaifu-gun (JP); Tadaaki Ikeda, Anan (JP)

(73) Assignee: NICHIA CORPORATION, Anan (JP)

( * ) Notice: Subject to any disclaimer, the term of this patent is extended or adjusted under 35 U.S.C. 154(b) by 243 days.

(21) Appl. No.: 17/233,767

(22) Filed: Apr. 19, 2021

(65) Prior Publication Data
US 2021/0257524 A1    Aug. 19, 2021

Related U.S. Application Data (62) Division of application No. 16/682,062, filed on Nov. 13, 2019, now Pat. No. 11,011,688.

(30) Foreign Application Priority Data

Nov. 14, 2018  (JP) .............................. JP2018-214169

(51) Int. Cl.
*H01L 33/60*   (2010.01)
*H01L 33/50*   (2010.01)
(Continued)

(52) U.S. Cl.
CPC .......... *H01L 33/60* (2013.01); *H01L 25/0756* (2013.01); *H01L 33/38* (2013.01);
(Continued)

(58) Field of Classification Search
CPC ....... H01L 33/60; H01L 33/505; H01L 33/38; H01L 33/62; H01L 25/0756;
(Continued)

(56) References Cited

U.S. PATENT DOCUMENTS 9,151,884 B2 * 10/2015 Rutherford .......... G02B 6/0003
9,482,937 B2 * 11/2016 Cheng ................ G03B 21/2033
(Continued)

FOREIGN PATENT DOCUMENTS

JP   2000-244020 A    9/2000
JP   2005-158795 A    6/2005
(Continued)

OTHER PUBLICATIONS

Notice of Allowance on U.S. Appl. No. 16/682,062 dated Feb. 5, 2021.

*Primary Examiner* — Mohammad M Hoque
(74) *Attorney, Agent, or Firm* — Foley & Lardner LLP (57) ABSTRACT

A method of manufacturing a light emitting element includes: providing a first light emitting part and a second light emitting part, the first light emitting part comprising a first base member and a first semiconductor layered body, the second light emitting part comprising a second base member and a second semiconductor layered body; bonding the first and second light emitting parts to each other such that the first base member and the second base member are disposed between the first semiconductor layered body and the second semiconductor layered body; disposing a light reflecting member to cover the bonded first and second light emitting parts; removing a portion of the light reflecting member to expose surfaces of the first and second base members; and disposing a wavelength conversion member on the exposed surface of the first base member and the exposed surface of the second base member.

18 Claims, 8 Drawing Sheets

(51) Int. Cl.
  *H01L 33/38* (2010.01)
  *H01L 33/62* (2010.01)
  *H01L 25/075* (2006.01)

(52) U.S. Cl.
  CPC ............ *H01L 33/505* (2013.01); *H01L 33/62* (2013.01); *H01L 2933/0033* (2013.01); *H01L 2933/0041* (2013.01); *H01L 2933/0058* (2013.01); *H01L 2933/0091* (2013.01)

(58) Field of Classification Search
  CPC ..... H01L 2933/0091; H01L 2933/0033; H01L 2933/0058; H01L 2933/0041; H01L 2933/005; H01L 33/56; H01L 33/508
  USPC .......................................................... 257/89
  See application file for complete search history.

(56) References Cited

U.S. PATENT DOCUMENTS

| | | | |
|---|---|---|---|
| 10,698,150 B2 * | 6/2020 | Vrehen | ................ G02B 6/0085 |
| 2005/0110032 A1 | 5/2005 | Saito et al. | |
| 2006/0227570 A1 * | 10/2006 | Rutherford | ............ H04N 9/315 |
| | | | 348/E9.027 |
| 2007/0279915 A1 * | 12/2007 | Rutherford | .......... G03B 21/204 |
| | | | 362/341 |
| 2009/0196046 A1 | 8/2009 | Rutherford et al. | |
| 2014/0299836 A1 | 10/2014 | Wu | |
| 2015/0137164 A1 | 5/2015 | Ichikawa | |
| 2016/0147135 A1 | 5/2016 | Cheng | |
| 2017/0315433 A1 * | 11/2017 | Ronda | ................ G03B 21/2066 |
| 2018/0151785 A1 | 5/2018 | Hashimoto | |
| 2020/0033536 A1 * | 1/2020 | Suzuki | ................ G03B 21/204 |
| 2020/0064722 A1 * | 2/2020 | Suzuki | ............... G03B 21/2066 |
| 2020/0083408 A1 * | 3/2020 | Sakata | ............... G03B 21/2013 |
| 2020/0241190 A1 * | 7/2020 | Ivanova | ............... G02B 6/0003 |

FOREIGN PATENT DOCUMENTS

| | | |
|---|---|---|
| JP | 2006-173326 A | 6/2006 |
| JP | 2014-204118 A | 10/2014 |
| JP | 2015-097235 A | 5/2015 |
| JP | 3197983 U | 6/2015 |
| JP | 2018-092989 A | 6/2018 |

\* cited by examiner

METHOD OF MANUFACTURING LIGHT EMITTING ELEMENT

CROSS-REFERENCE TO RELATED APPLICATION

The present application is a divisional of U.S. patent application Ser. No. 16/682,062, filed on Nov. 13, 2019, which claims priority to Japanese Patent Application No. 2018-214169, filed on Nov. 14, 2018. The contents of these applications are incorporated herein by reference in their entireties.

BACKGROUND

1. Technical Field

The present disclosure relates to a light emitting element, a light emitting device, and a method of manufacturing a light emitting element.

2. Description of Related Art

Light emitting elements are required to have good light emitting characteristics (for example, see Japanese Utility Model No. 3197983).

SUMMARY

Certain embodiments of the present invention allows for obtaining a light emitting element and a light emitting device having improved light emitting characteristics, and a method of manufacturing the light emitting element.

A light emitting element according to one embodiment of the present invention includes: a light reflecting member including a first region and a second region; a first semiconductor layered body disposed between the first region and the second region and configured to emit first light having a first peak wavelength; a second semiconductor layered body disposed between the first semiconductor layered body and the second region and configured to emit second light having a second peak wavelength different from the first peak wavelength; a base member disposed between the first semiconductor layered body and the second semiconductor layered body; and a wavelength conversion member on which the first light and the second light is incident, the wavelength conversion member producing third light having a third peak wavelength different from the first peak wavelength and the second peak wavelength, the wavelength conversion member including a first portion, a second portion, and a third portion between the first portion and the second portion in a first direction from the first region to the second region and facing the base member. The light reflecting member has a reflectance to the first light higher than a reflectance of the wavelength conversion member to the first light. The light reflecting member has a reflectance to the second light is higher than a reflectance of the wavelength conversion member to the second light. A portion of the first region is located between the first portion and a portion of the first semiconductor layered body in a second direction perpendicular to the first direction. A portion of the second region is located between the second portion and a portion of the second semiconductor layered body in the second direction. The first light and the second light propagate in the base member, and are incident on the third portion.

A method of manufacturing a light emitting element according to another embodiment of the present invention includes: providing a first light emitting part and a second light emitting part, the first light emitting part including a first base member and a first semiconductor layered body, the second light emitting part including a second base member and a second semiconductor layered body; bonding the first light emitting part and the second light emitting part to each other such that the first base member and the second base member are disposed between the first semiconductor layered body and the second semiconductor layered body; disposing a light reflecting member to cover the bonded first light emitting part and second light emitting part; removing a portion of the light reflecting member to expose a surface of the first base member and a surface of the second base member; and disposing a wavelength conversion member on a surface of the first base member and a surface of the second base member.

A method of manufacturing a light emitting element according to still another embodiment of the present invention includes: providing a first light emitting part and a second light emitting part, the first light emitting part including a first base member, a first light reflecting member, and a first semiconductor layered body between the first base member and the first light reflecting member, the second light emitting part including a second base member, a second light reflecting member, and a second semiconductor layered body between the second base member and the second light reflecting member; bonding the first light emitting part and the second light emitting part to each other such that the first base member and the second base member are disposed between the first semiconductor layered body and the second semiconductor layered body; removing a portion of the first light reflecting member and a portion of the second light reflecting member to expose a surface of the first base member and a surface of the second base member; and disposing a wavelength conversion member on the exposed surface of the first base member and the exposed surface of the second base member.

Certain embodiments of the present disclosure allow for obtaining a light emitting element and a light emitting device having improved light emitting characteristics, and a method of manufacturing the light emitting element.

DETAILED DESCRIPTION OF EMBODIMENTS

Hereinafter, certain embodiments of the present disclosure will be described with reference to the drawings.

The drawings are schematic, and the relationship between a thickness and a width of a component in the drawings, ratios between sizes of portions in the drawings, and the like may not be the same as those in actual light emitting devices. Further, the same portion may be illustrated with different dimensions or ratios among the drawings.

In the specification of the present application, the same elements as those described earlier with reference to the drawings may be denoted by the same reference numerals, and detailed descriptions thereof may be omitted as appropriate.

First Embodiment

Figure 1:
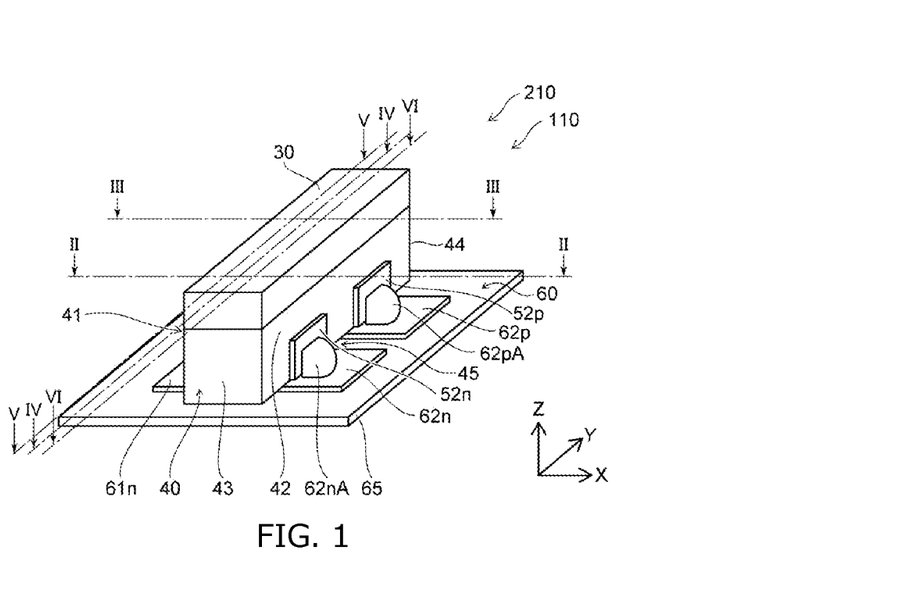
FIG. 1 is a schematic perspective view illustrating a light emitting element and a light emitting device according to a first embodiment.

FIG. 1 is a schematic perspective view showing an example of a light emitting element and an example of a light emitting device according to a first embodiment.

FIGS. 2 to 6 are schematic cross-sectional views showing an example of the light emitting element and an example of the light emitting device according to the first embodiment.

Figure 2:
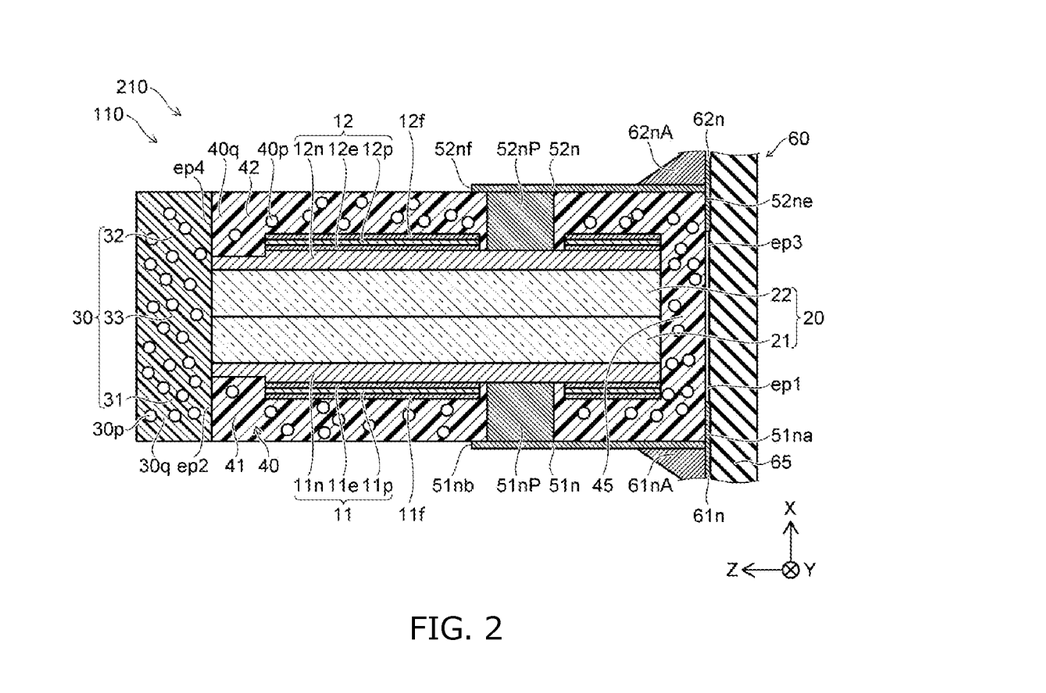
FIG. 2 is a schematic cross-sectional view illustrating the light emitting element and the light emitting device according to the first embodiment at a cross-section taken along line II-II in FIG. 1.
Figure 3:
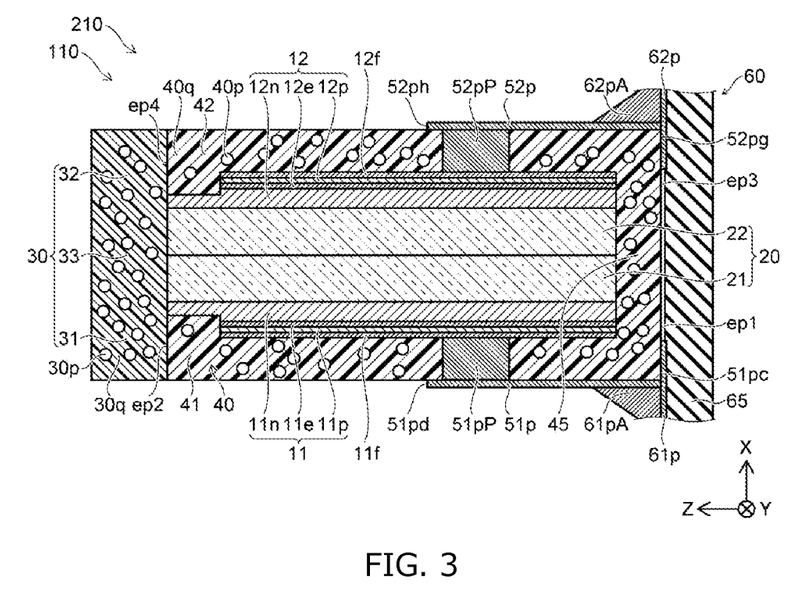
FIG. 3 is a schematic cross-sectional view illustrating the light emitting element and the light emitting device according to the first embodiment at a cross-section taken along line in FIG. 1.
Figure 4:
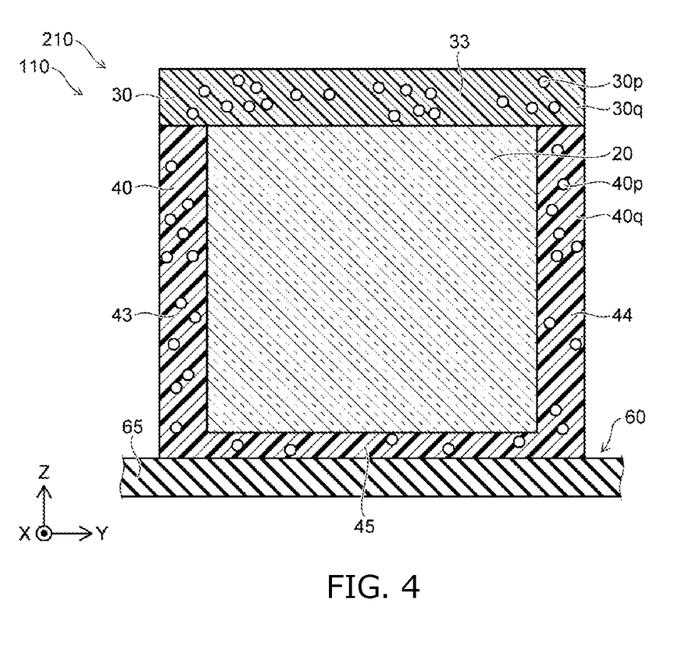
FIG. 4 is a schematic cross-sectional view illustrating the light emitting element and the light emitting device according to the first embodiment at a cross-section taken along line IV-IV in FIG. 1.
Figure 5:
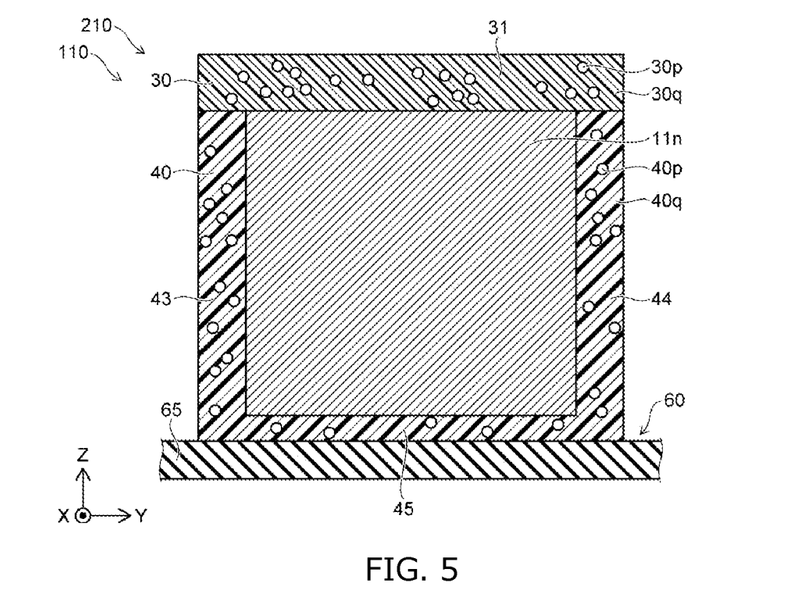
FIG. 5 is a schematic cross-sectional view illustrating the light emitting element and the light emitting device according to the first embodiment at a cross-section taken along line V-V in FIG. 1.
Figure 6:
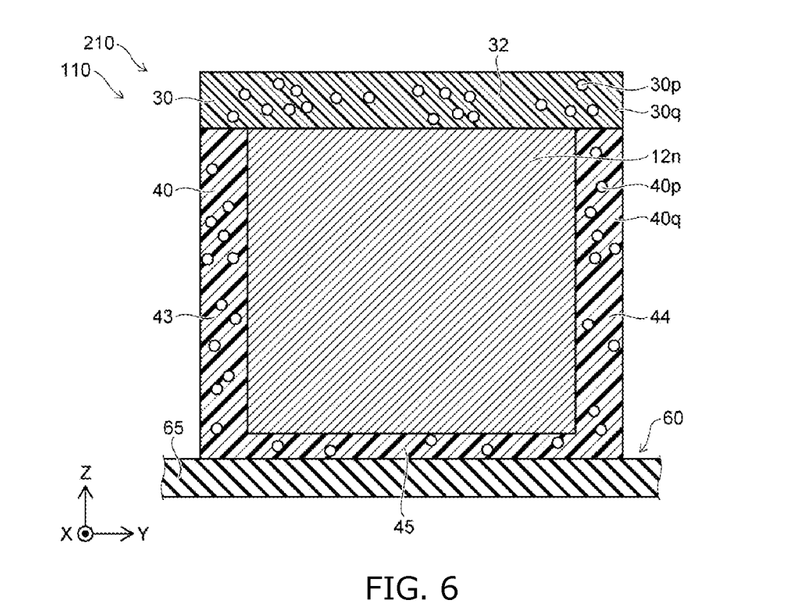
FIG. 6 is a schematic cross-sectional view illustrating the light emitting element and the light emitting device according to the first embodiment at a cross-section taken along line VI-VI in FIG. 1.

FIG. 2 illustrates a cross-section taken along line II-II in FIG. 1. FIG. 3 illustrates a cross-section taken along line in FIG. 1. FIG. 4 illustrates a cross-section taken along line IV-IV in FIG. 1. FIG. 5 illustrates a cross-section taken along line V-V in FIG. 1. FIG. 6 illustrates a cross-section taken along line VI-VI in FIG. 1.

As shown in FIG. 1, a light emitting device 210 includes a light emitting element 110 and a mounting member 60. The light emitting element 110 is disposed on the mounting member 60.

As shown in FIG. 2, the light emitting element 110 includes a light reflecting member 40, a first semiconductor layered body 11, a second semiconductor layered body 12, a base member 20 and a wavelength conversion member 30.

The light reflecting member 40 includes a first region 41 and a second region 42. As described below, the light reflecting member 40 may further include a third region 43, a fourth region 44 and a fifth region 45.

The first semiconductor layered body 11 is located between the first region 41 and the second region 42. The first semiconductor layered body 11 is configured to emit first light having a first peak wavelength.

The first semiconductor layered body 11 includes, for example, a first n-type semiconductor layer 11$n$, a first light emitting layer 11$e$, and a first p-type semiconductor layer 11$p$. The first p-type semiconductor layer 11$p$ is located between the first n-type semiconductor layer 11$n$ and the first region 41. The first light emitting layer 11$e$ is located between the first n-type semiconductor layer 11$n$ and the first p-type semiconductor layer 11$p$.

The second semiconductor layered body 12 is located between the first semiconductor layered body 11 and the second region 42. The second semiconductor layered body 12 is configured to emit second light having a second peak wavelength. The second peak wavelength is different from the first peak wavelength.

The second semiconductor layered body 12 includes, for example, a second n-type semiconductor layer 12$n$, a second light emitting layer 12$e$ and a second p-type semiconductor layer 12$p$. The second p-type semiconductor layer 12$p$ is located between the second n-type semiconductor layer 12$n$ and the second region 42. The second light emitting layer 12$e$ is located between the second n-type semiconductor layer 12$n$ and the second p-type semiconductor layer 12$p$.

When a current is supplied to the first semiconductor layered body 11, first light is emitted from the first light emitting layer 11$e$. When a current is supplied to the second semiconductor layered body 12, second light is emitted from the second light emitting layer 12$e$. The first light is, for example, blue light. The second light is, for example, green light. The first peak wavelength is, for example, in a range of 430 nm to 480 nm. The second peak wavelength is, for example, in a range of 500 nm to 540 nm.

The base member 20 is located between the first semiconductor layered body 11 and the second semiconductor layered body 12. In this example, the base member 20 includes a first base member 21 and a second base member 22. The second base member 22 is located between the first base member 21 and the second semiconductor layered body 12. In this example, the second base member 22 is in contact with the first base member 21. For example, a surface of the second base member 22 on which the second semiconductor layered body 12 is not disposed is in contact with a surface of the first base member 21 on which the first semiconductor layered body 11 is not disposed.

In one example, nitride semiconductors may be used for the first semiconductor layered body 11 and the second semiconductor layered body 12. For the base member 20, for example, sapphire is used. For the first base member 21 and the second base member 22, for example, sapphire is used. The first semiconductor layered body 11 is epitaxially grown on the first base member 21. The second semiconductor layered body 12 is epitaxially grown on the second base member 22.

The first light emitted from the first light emitting layer 11e is incident on the first base member 21, and propagates in the first base member 21 and the second base member 22. The second light emitted from the second light emitting layer 12e is incident on the second base member 22, and propagates in the first base member 21 and the second base member 22.

As used herein, the direction from the first region 41 to the second region 42 is referred to as a "first direction" or an "X-axis direction". Further, as used herein, a direction perpendicular to the X-axis direction is referred to as a "Z-axis direction", and a direction perpendicular to the X-axis direction and the Z-axis direction is referred to as a "Y-axis direction".

As described above, the first semiconductor layered body 11 and the second semiconductor layered body 12 are located between the first region 41 and the second region 42 in the X-axis direction.

On the other hand, the direction from the wavelength conversion member 30 to the first semiconductor layered body 11 crosses the X-axis direction. The direction from the wavelength conversion member 30 to the second semiconductor layered body 12 crosses the X-axis direction.

The wavelength conversion member 30 includes, for example, a first portion 31, a second portion 32 and a third portion 33. The third portion 33 is located between the first portion 31 and the second portion 32 in the X-axis direction (i.e., first direction from the first region 41 to the second region 42). The third portion 33 faces the base member 20 (i.e., first base member 21 and second base member 22) in the Z-axis direction. The first light and the second light are incident on the wavelength conversion member 30. For example, the first light and the second light propagate in the base member 20, and is incident on the third portion 33. The first light and the second light may be incident on the first portion 31 and the second portion 32. The wavelength conversion member 30 produces third light having a third peak wavelength. The third peak wavelength is different from the first peak wavelength, and is also different from the second peak wavelength. Examples of the wavelength conversion member 30 include a fluorescent material.

In one example, the first light is blue light, the second light is green light, and the third light is yellow light. A light emitted from the wavelength conversion member 30 includes first light, second light and third light. A light emitted from the wavelength conversion member 30 (light emitted from the light emitting element 110) is, for example, white light.

The reflectance of the light reflecting member 40 to the first light is higher than the reflectance of the wavelength conversion member 30 to the first light. The reflectance of the light reflecting member 40 to the second light is higher than the reflectance of the wavelength conversion member 30 to the second light. With a high reflectance of the light reflecting member 40, the first light and the second light can be reflected toward the base member 20 by the light reflecting member 40, can propagate through the base member 20, and can be efficiently incident on the wavelength conversion member 30.

For example, the base member 20 is in contact with the wavelength conversion member 30. For example, the base member 20 and the third portion 33 of the wavelength conversion member 30 are in contact with each other. The first light and the second light having propagated through the base member 20 can be directly incident on the wavelength conversion member 30.

In the first embodiment, a portion of the first region 41 is located between the first portion 31 and a portion of the first semiconductor layered body 11 in a second direction (Z-axis direction in this example) orthogonal to the first direction. A portion of the second region 42 is located between the second portion 32 and a portion of the second semiconductor layered body 12 in the second direction (Z-axis direction in this example).

As shown in FIG. 2, for example, a portion of the first region 41 is located between the first portion 31 and the first light emitting layer 11e in the Z-axis direction. This allows for reducing direct incidence of first light, which is generated in the first light emitting layer 11e, on the wavelength conversion member 30. For example, a portion of the second region 42 is located between the second portion 32 and the second light emitting layer 12e in the Z-axis direction. This allows for reducing direct incidence of second light, which is generated in the second light emitting layer 12e, on the wavelength conversion member 30. A portion of the first region 41 may be in contact with, for example, the base member 21. This allows for reducing direct incidence of first light, which is generated in the first semiconductor structure 11, on the wavelength conversion member 30. A portion of the second region 42 may be in contact with, for example, the base member 22. This allows for reducing direct incidence of second light, which is generated in the second semiconductor structure 12, on the wavelength conversion member 30.

For example, in a first reference example, the first light emitting layer 11e and the second light emitting layer 12e are in contact with the wavelength conversion member 30. In the configuration of the first reference example, the first light generated in the first light emitting layer 11e and the second light generated in the second light emitting layer 12e are directly incident on the wavelength conversion member 30. In this case, when light of different colors is incident on two portions of the wavelength conversion member 30 (for example, the first portion 31 and the second portion 32), for example, blue light and green light are separately emitted from the light emitting element 110. Accordingly, blue light and green light may not be sufficiently mixed, so that color of light emitted from the light emitting element 110 may be uneven.

On the other hand, in the first embodiment, the first light and the second light are reflected and propagate inside the base member 20. Accordingly, light with a mixed color, in which a color of first light and a color of second light is sufficiently mixed, can be incident on the wavelength conversion member 30. This allows for obtaining light in a wide range of colors. According to the first embodiment, it is possible to provide a light emitting element in which light emitting characteristics can be improved.

In the first embodiment, a portion of the first n-type semiconductor layer 11n and a portion of the second n-type semiconductor layer 12n may be in contact with the wavelength conversion member 30. The first light and the second light may propagate in the base member 20, the first n-type semiconductor layer 11n, and the second n-type semiconductor layer 12n, and be incident on the wavelength conversion member 30. Accordingly, the first light and the second light are reflected and propagate inside the base member 20, which causes a color of first light and a color of second light to be sufficiently mixed, and are then incident on the wavelength conversion member 30 with colors that are sufficiently mixed.

In the first embodiment, a portion of the first region 41 may be located between the first portion 31 and at least a portion of the first semiconductor layered body 11 in the second direction (i.e., z-axis direction). A portion of the second region 42 may be located between the second portion 32 and at least a portion of the second semiconductor layered body 12 in the second direction (i.e., z-axis direction). With this structure, direct incidence of light emitted from the light emitting layer on the wavelength conversion member 30 can be reduced.

For example, at least a portion of the first n-type semiconductor layer 11n is in contact with the first portion 31. A portion of the first region 41 is located between the first portion 31 and the first p-type semiconductor layer 11p in the second direction (for example z-axis direction). A portion of the first region 41 is located between the first portion 31 and the first light emitting layer 11e in the second direction.

For example, at least a portion of the second n-type semiconductor layer 12n is in contact with the second portion 32. A portion of the second region 42 is located between the second portion 32 and the second p-type semiconductor layer 12p in the second direction (for example z-axis direction). A portion of the second region 42 is located between the second portion 32 and the second light emitting layer 12e in the second direction.

As shown in FIG. 1 and FIGS. 4 to 6, the light reflecting member 40 may further include the third region 43, the fourth region 44, and the fifth region 45.

The first semiconductor layered body 11, the second semiconductor layered body 12 and the base member 20 are located between the third region 43 and the fourth region 44 in a third direction. The third direction is perpendicular to a plane extending along the first direction and the second direction. The third direction is, for example, a Y-axis direction. The first semiconductor layered body 11, the second semiconductor layered body 12, and the base member 20 are located between the wavelength conversion member 30 and the fifth region 45 of the light reflecting member 40 in the second direction (for example, a Z-axis direction).

The first light and the second light are reflected by the third region 43, the fourth region 44, and the fifth region 45. Accordingly, emission of first light and second light to the outside through the light reflecting member 40 can be reduced, and the first light and the second light can propagate in the base member 20 are efficiently incident on the wavelength conversion member 30.

As shown in FIGS. 2 and 3, the light emitting element 110 further includes a first n-side electrode 51n and a first p-side electrode 51p. The first n-side electrode 51n is electrically connected to the first n-type semiconductor layer 11n. The first p-side electrode 51p is electrically connected to the first p-type semiconductor layer 11p.

In this example, the first n-side electrode 51n is electrically connected to the first n-type semiconductor layer 11n via a first n-side electrically conductive member 51nP. The first p-side electrode 51p is electrically connected to the first p-type semiconductor layer 11p via a first p-side electrically conductive member 51pP.

At least a portion of the first n-side electrode 51n is exposed from the first region 41. At least a portion of the first n-side electrode 51n is not covered with the first region 41. At least a portion of the first p-side electrode 51p is exposed from the first region 41. At least a portion of the first p-side electrode 51p is not covered with the first region 41.

A current is supplied to the first semiconductor layered body 11 through the first n-side electrode 51n and the first p-side electrode 51p, so that first light is emitted from the first light emitting layer 11e.

As shown in FIGS. 2 and 3, the light emitting element 110 includes a second n-side electrode 52n and a second p-side electrode 52p. The second n-side electrode 52n is electrically connected to the second n-type semiconductor layer 12n. The second p-side electrode 52p is electrically connected to the second p-type semiconductor layer 12p.

In this example, the second n-side electrode 52n is electrically connected to the second n-type semiconductor layer 12n via a second n-side electrically conductive member 52nP. The second p-side electrode 52p is electrically connected to the second p-type semiconductor layer 12p via a second p-side electrically conductive member 52pP.

At least a portion of the second n-side electrode 52n is exposed from the second region 42. At least a portion of the second n-side electrode 52n is not covered with the second region 42. At least a portion of the second p-side electrode 52p is exposed from the second region 42. At least a portion of the second p-side electrode 52p is not covered with the second region 42.

A current is supplied to the second semiconductor layered body 12 through the second n-side electrode 52n and the second p-side electrode 52p, so that first light is emitted from the second light emitting layer 12e.

In this example, the mounting member 60 includes a mounting substrate portion 65, a first n-side electrically conductive layer 61n, a first p-side electrically conductive layer 61p, a second n-side electrically conductive layer 62n and a second p-side electrically conductive layer 62p. The first n-side electrically conductive layer 61n, the first p-side electrically conductive layer 61p, the second n-side electrically conductive layer 62n and the second p-side electrically conductive layer 62p are disposed on the mounting substrate portion 65.

The first n-side electrically conductive layer 61n is located between the mounting substrate portion 65 and the first n-side electrode 51n. The first p-side electrically conductive layer 61p is located between the mounting substrate portion 65 and the first p-side electrode 51p. The second n-side electrically conductive layer 62n is located between the mounting substrate portion 65 and the second n-side electrode 52n. The second p-side electrically conductive layer 62p is located between the mounting substrate portion 65 and the second p-side electrode 52p.

For example, the first n-side electrode 51n and the first n-side electrically conductive layer 61n are electrically connected to each other via a first n-side connection member 61nA. The first p-side electrode 51p and the first p-side electrically conductive layer 61p are electrically connected to each other via a first p-side connection member 61pA. The second n-side electrode 52n and the second n-side electrically conductive layer 62n are electrically connected to each other via a second n-side connection member 62nA. The second p-side electrode 52p and the second p-side electrically conductive layer 62p are electrically connected to each other via a second p-side connection member 62pA. Examples of the connection members include solder.

For example, a current is supplied to the first semiconductor layered body 11 through the first n-side electrically conductive layer 61n and the first p-side electrically conductive layer 61p. A current is supplied to the second semiconductor layered body 12 through the second n-side electrically conductive layer 62n and the second p-side electrically conductive layer 62p.

As shown in FIG. 2, the first region 41 includes a first end portion ep1 and a second end portion ep2. The second end portion ep2 is located between the first end portion ep1 and the first portion 31 in the second direction (Z-axis direction in this example).

The first n-side electrode 51n includes a first electrode end portion 51na and a second electrode end portion 51nb. The second electrode end portion 51nb is located between the first electrode end portion 51na and the first portion 31 in the second direction (Z-axis direction in this example).

The first electrode end portion 51na and the first end portion ep1 are in the same plane. For example, the direction from the first electrode end portion 51na to the first end portion ep1 is along the first direction (X-axis direction).

As shown in FIG. 3, the first p-side electrode 51p includes a third electrode end portion 51pc and a fourth electrode end portion 51pd. The fourth electrode end portion 51pd is located between the third electrode end portion 51pc and the first portion 31 in the second direction (Z-axis direction in this example).

The third electrode end portion 51pc and the first end portion ep1 are in the same plane. For example, the direction from the third electrode end portion 51pc to the first end portion ep1 is along the first direction (X-axis direction).

As shown in FIG. 2, the second region 42 includes a third end portion ep3 and a fourth end portion ep4. The fourth end portion ep4 is located between the third end portion ep3 and the second portion 32 in the second direction (Z-axis direction in this example).

The second n-side electrode 52n includes a fifth electrode end portion 52ne and a sixth electrode end portion 52nf. The sixth electrode end portion 52nf is present between the fifth electrode end portion 52ne and the second portion 32 in the second direction (Z-axis direction in this example).

The fifth electrode end portion 52ne and the third end portion ep3 are in the same plane. For example, the direction from the fifth electrode end portion 52ne to the third end portion ep3 is along the first direction (X-axis direction).

As shown in FIG. 3, the second p-side electrode 52p includes a seventh electrode end portion 52pg and an eighth electrode end portion 52ph. The eighth electrode end portion 52ph is located between the seventh electrode end portion 52pg and the second portion 32 in the second direction (Z-axis direction in this example).

The seventh electrode end portion 52pg and the third end portion ep3 are in the same plane. For example, the direction from the seventh electrode end portion 52pg to the third end portion ep3 is along the first direction (X-axis direction).

With the electrode end portion and the end portion of the light reflecting member 40 located in the same plane, an end portion of the light emitting element 110 at the fifth region 45 side is substantially a plane surface. This allows for facilitating mounting of the light emitting element 110 on the mounting member 60.

As shown in FIGS. 1, 2 and 3, the second n-side electrode 52n and the second p-side electrode 52p are located at the mounting member 60 side on a lateral surface of the light reflecting member 40. As shown in FIGS. 2 and 3, the first n-side electrode 51n and the first p-side electrode 51p are located at the mounting member 60 side on a lateral surface of the light reflecting member 40. This allows for facilitating mounting of the light emitting element 110 on the mounting member 60.

As shown in FIGS. 2 and 3, the light emitting element 110 may further include a first reflecting film 11f. The first reflecting film 11f is located between the first region 41 and at least a portion of the first semiconductor layered body 11 in the first direction (X-axis direction). The light emitting element 110 may further include a second reflecting film 12f. The second reflecting film 12f is located between the second region 42 and a portion of the second semiconductor layered body 12 in the first direction (X-axis direction). The first reflecting film 11f and the second reflecting film 12f contain, for example, at least one selected from the group consisting of Ag and Al. Light emitted from the light emitting layer is efficiently reflected toward the base member 20 by the first reflecting film 11f and the second reflecting film 12f.

As shown in FIG. 2, the light reflecting member 40 contains a plurality of first particles 40p, and a first member 40q surrounding each of the plurality of first particles 40p. The plurality of first particles 40p includes, for example, at least one selected from the group consisting of titanium oxide and aluminum oxide. The first member 40q includes, for example, at least one selected from the group consisting of a silicone resin, an acrylic resin and an epoxy resin. The first member 40q may include, for example, glass or ceramics.

As shown in FIG. 2, the wavelength conversion member 30 includes a plurality of second particles 30p, and a second member 30q surrounding each of a plurality of second particles 30p. The plurality of second particles 30p includes, for example, a fluorescent material. The second member 30q includes, for example, at least one selected from the group consisting of a silicone resin, an acrylic resin and an epoxy resin.

In the light emitting element 110, the first base member 21 is directly bonded to the second base member 22. For example, direct bonding between the first base member 21 and the second base member 22 allows for easily increasing heat dissipation performance. In the first embodiment, a boundary between the first base member 21 and the second base member 22 may be unclear. For direct bonding, for example, normal temperature bonding such as atomic diffusion bonding or surface activation bonding is employed.

In the first embodiment, an additional layer may be further disposed between the first base member 21 and the second base member 22 as described below.

Figure 7:
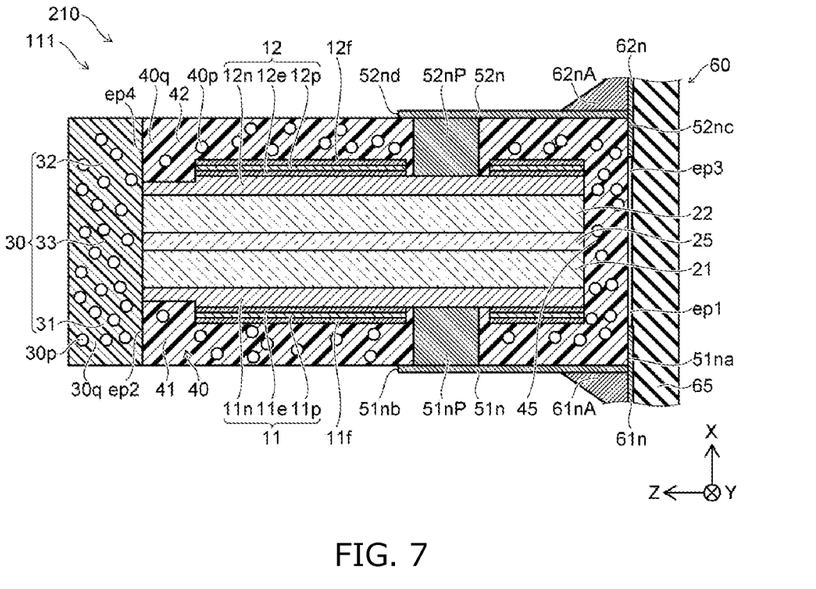
FIG. 7 is a schematic cross-sectional view illustrating the light emitting element and the light emitting device according to the first embodiment.
Figure 8:
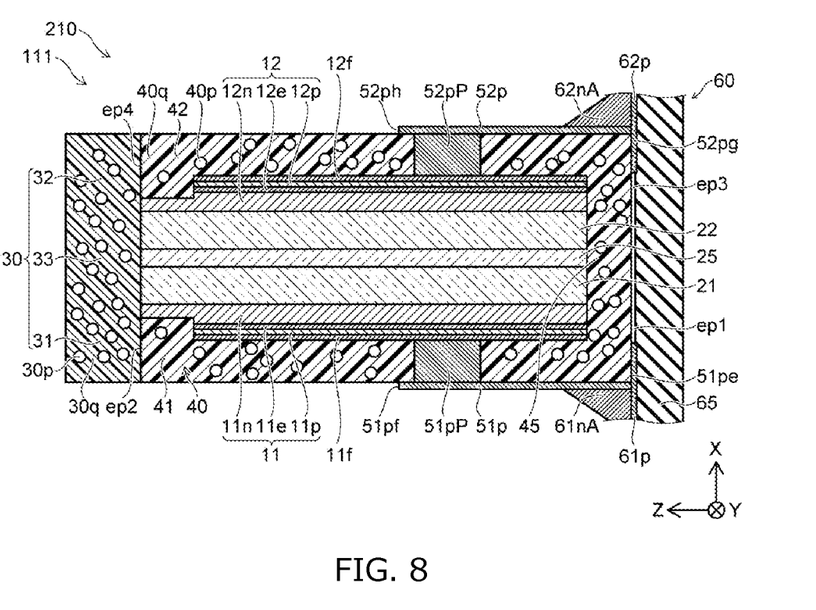
FIG. 8 is a schematic cross-sectional view illustrating the light emitting element and the light emitting device according to the first embodiment.

FIGS. 7 and 8 are schematic cross-sectional views illustrating a light emitting element 111 and the light emitting device 210 according to the first embodiment.

As shown in FIGS. 7 and 8, the light emitting element 111 according to the first embodiment includes the light reflecting member 40, the first semiconductor layered body 11, the second semiconductor layered body 12, the base member 20, and the wavelength conversion member 30. The base member 20 includes an intermediate layer 25 in addition to the first base member 21 and the second base member 22. The light reflecting member 40, the first semiconductor layered body 11, the second semiconductor layered body 12, and the wavelength conversion member 30 in the light emitting element 111 may have structures that are the same as those in the light emitting element 110. An example of the base member 20 in the light emitting element 111 will be described below.

In the light emitting element 111, the second base member 22 is located between the first base member 21 and the second semiconductor layered body 12. The intermediate layer 25 is located between the first base member 21 and the second base member 22.

For example, the intermediate layer 25 bonds the first base member 21 and the second base member 22. The intermediate layer 25 is, for example, an adhesive layer. The intermediate layer 25 includes, for example, a resin. For example, part of the intermediate layer 25 is in contact with the wavelength conversion member 30.

First light emitted from the first light emitting layer 11e passes through the first base member 21, and is incident on the intermediate layer 25. Second light emitted from the second light emitting layer 12e passes through the second base member 22, and is incident on the intermediate layer 25. The first light and the second light propagate in the intermediate layer 25, so that the first light and the second light are incident on the wavelength conversion member 30 in a state in which a color of the first light and a color of the second light are mixed well. According to the first embodiment, it is possible to provide a light emitting element in which light emitting characteristics can be improved.

In the first embodiment, the absolute value of a difference between the refractive index of the intermediate layer 25 for the first light and the refractive index of the first base member 21 for the first light is smaller than the absolute value of a difference between the refractive index of the first semiconductor layered body 11 for the first light and the refractive index of the first base member 21 for the first light. With this configuration, for example, absorption of light at an interface between the intermediate layer 25 and the first base member 21 can be reduced. Accordingly, optical loss is reduced, so that light emission efficiency can be increased.

In the first embodiment, the absolute value of a difference between the refractive index of the intermediate layer 25 for the second light and the refractive index of the second base member 22 for the second light is smaller than the absolute value of a difference between the refractive index of the second semiconductor layered body 12 for the second light and the refractive index of the second base member 22 for the second light. With this configuration, for example, absorption of light at an interface between the intermediate layer 25 and the second base member 22 is suppressed. Accordingly, optical loss is reduced, so that light emission efficiency can be increased.

Figure 9:
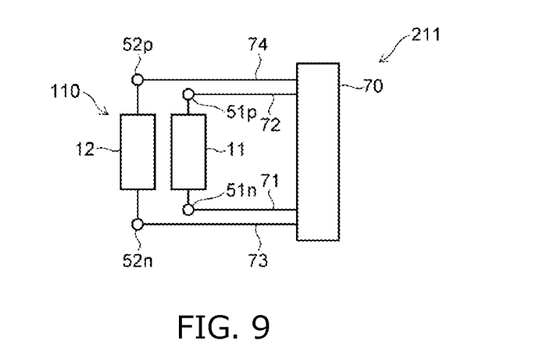
FIG. 9 is a schematic diagram illustrating the light emitting device according to the first embodiment.

FIG. 9 is a schematic diagram showing a light emitting device 211 according to the first embodiment.

As shown in FIG. 9, the light emitting device 211 includes the light emitting element 110 and a driving circuit 70. The light emitting device 211 may include the light emitting element 111 and a driving circuit 70.

The driving circuit 70 is electrically connected to the first semiconductor layered body 11 and the second semiconductor layered body 12. For example, the driving circuit 70 is electrically connected to the first n-side electrode 51n via a first wire 71. The driving circuit 70 is electrically connected to the first p-side electrode 51p via a second wire 72. The driving circuit 70 is electrically connected to the second n-side electrode 52n via a third wire 73. The driving circuit 70 is electrically connected to the second p-side electrode 52p via a fourth wire 74.

The driving circuit 70 is configured to supply a first current to the first semiconductor layered body 11, and to supply a second current to the second semiconductor layered body 12. The driving circuit 70 is configured to individually change the current values of the first current and the second current. Individually driving the first semiconductor layered body 11 and the second semiconductor layered body 12 allows for easily obtaining a desired emission color.

Second Embodiment

A method of manufacturing a light emitting element according to a second embodiment of the present invention will be described below.

FIGS. 10A to 10C and FIGS. 11A and 11B are schematic cross-sectional views illustrating the method of manufacturing a light emitting element according to the second embodiment.

Figure 10A:
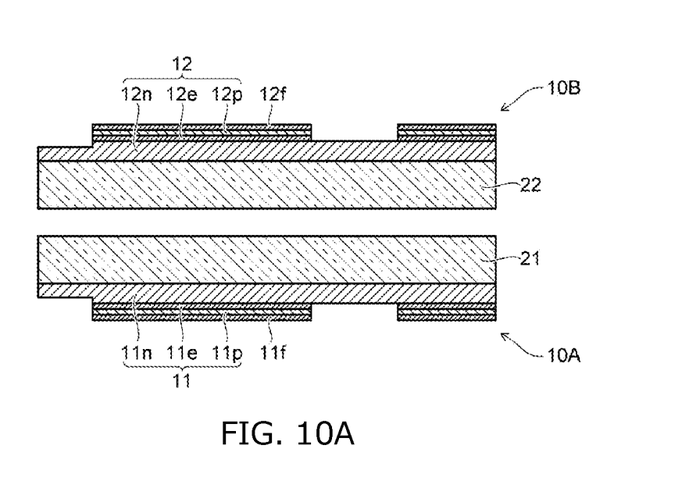
FIG. 10A is a schematic cross-sectional view illustrating a method of manufacturing a light emitting element according to a second embodiment.

As shown in FIG. 10A, a first light emitting part 10A and a second light emitting part 10B are provided. The first light emitting part 10A includes a first base member 21 and a first semiconductor layered body 11. The second light emitting part 10B includes a second base member 22 and a second semiconductor layered body 12.

Figure 10B:
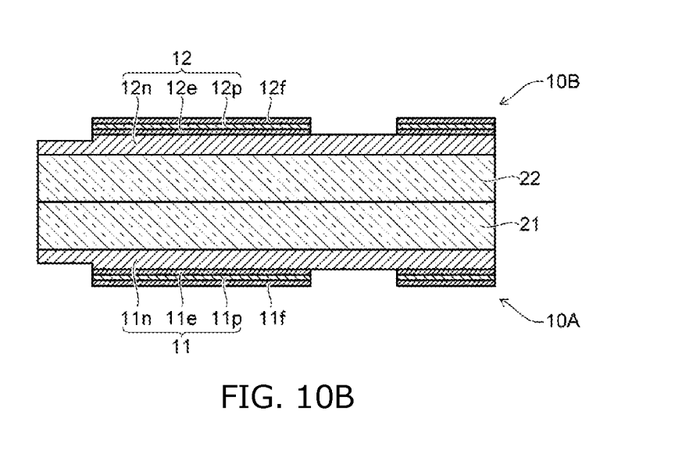
FIG. 10B is a schematic cross-sectional view illustrating the method of manufacturing a light emitting element according to the second embodiment.

As shown in FIG. 10B, the first light emitting part 10A and the second light emitting part 10B are bonded to each other such that the first base member 21 and the second base member 22 are disposed between the first semiconductor layered body 11 and the second semiconductor layered body 12. The first base member 21 and the second base member 22 are bonded to each other using, for example, direct bonding in which pressure is applied at a normal temperature.

Figure 10C:
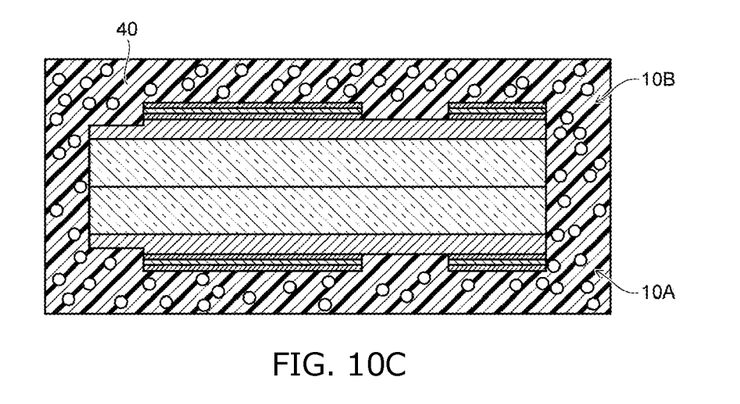
FIG. 10C is a schematic cross-sectional view illustrating the method of manufacturing a light emitting element according to the second embodiment.

As shown in FIG. 10C, a light reflecting member 40 is formed such that the light reflecting member 40 integrally covers the first light emitting part 10A and second light emitting part 10B that are bonded together.

Figure 11A:
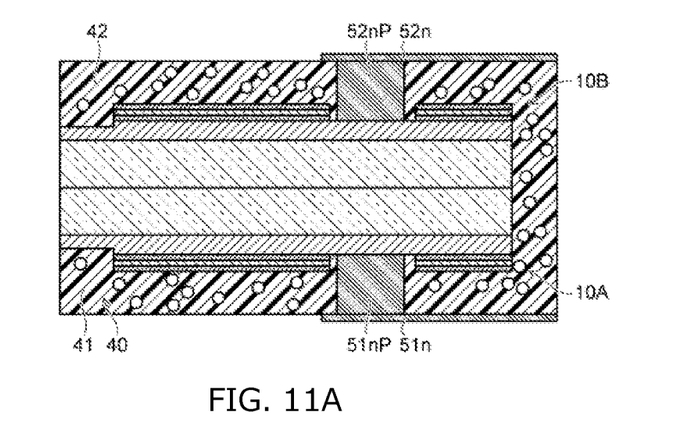
FIG. 11A is a schematic cross-sectional view illustrating the method of manufacturing a light emitting element according to the second embodiment.

As shown in FIG. 11A, a first n-side electrically conductive member 51nP, a first n-side electrode 51n, a second n-side electrically conductive member 52nP, and a second n-side electrode 52n are formed. Further, a first p-side electrically conductive member 51pP, a first p-side electrode 51p, a second p-side electrically conductive member 52pP and a second p-side electrode 52p are formed as shown in FIG. 3. For example, a portion of the light reflecting member 40 is removed to expose a first n-type semiconductor layer 11n and a second n-type semiconductor layer 12n from the light reflecting member 40. The first n-side electrically conductive member 51nP is formed to be connected to the first n-type semiconductor layer 11n exposed from the light reflecting member 40. The second n-side electrically conductive member 52nP is formed to be connected to the second n-type semiconductor layer 12n exposed from the light reflecting member 40. The first n-side electrode 51 is formed to be in contact with the light reflecting member 40 and to be connected to the first n-side electrically conductive member 51nP. The second n-side electrode 52 is formed to be in contact with the light reflecting member 40 and to be connected to the second n-side electrically conductive member 52nP.

As shown in FIG. 11A, a portion of the light reflecting member 40 is removed to expose a surface of the first base member 21 and a surface of the second base member 22. The removal of a portion of the light reflecting member 40 is performed by, for example, polishing. The removal is performed such that a portion of the light reflecting member 40 in a region provided with the first n-side electrode 51n and the second n-side electrode 52n remains.

Figure 11B:
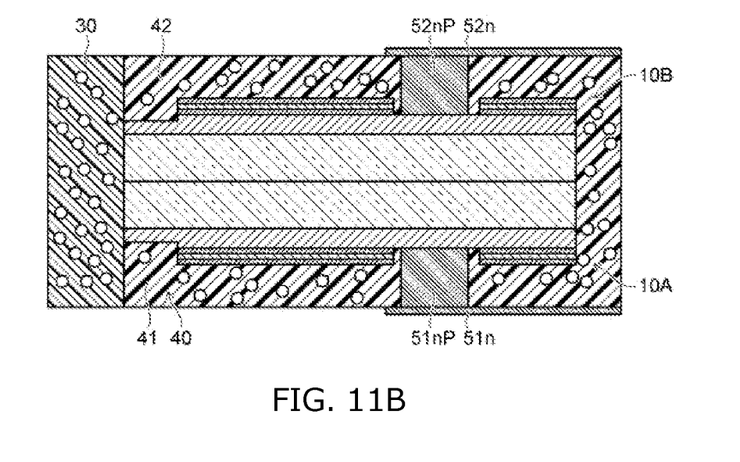
FIG. 11B is a schematic cross-sectional view illustrating the method of manufacturing a light emitting element according to the second embodiment.

As shown in FIG. 11B, a wavelength conversion member 30 is formed on a surface of the first base member 21 and a surface of the second base member 22 that are exposed from the light reflecting member 40. The wavelength conversion member 30 may be disposed continuously on the exposed surface of the first base member 21 and the exposed surface of the second base member 22 and a surface of the light reflecting member 40 continuously.

In this manner, the light emitting element 110 is obtained. According to the second embodiment, it is possible to provide a method of manufacturing a light emitting element in which light emitting characteristics can be improved.

Figure 12:
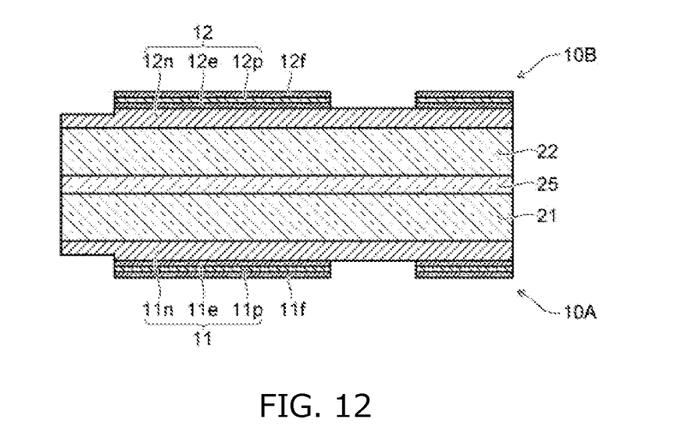
FIG. 12 is a schematic cross-sectional view illustrating the method of manufacturing a light emitting element according to the second embodiment.

FIG. 12 is a schematic cross-sectional view illustrating a method of manufacturing a light emitting element according to the second embodiment. As shown in FIG. 12, the first light emitting part 10A and the second light emitting part 10B are provided, and then an intermediate layer 25 is disposed between the first base member 21 and the second base member 22. For example, the first base member 21 and the second base member 22 are bonded with a resin that forms the intermediate layer 25.

Thereafter, treatment as described with reference to FIGS. 10C, 11A and 11B is performed. In this manner, the light emitting element 111 is obtained. According to the second embodiment, it is possible to provide a method of manufacturing a light emitting element in which light emitting characteristics can be improved.

Figure 13A:
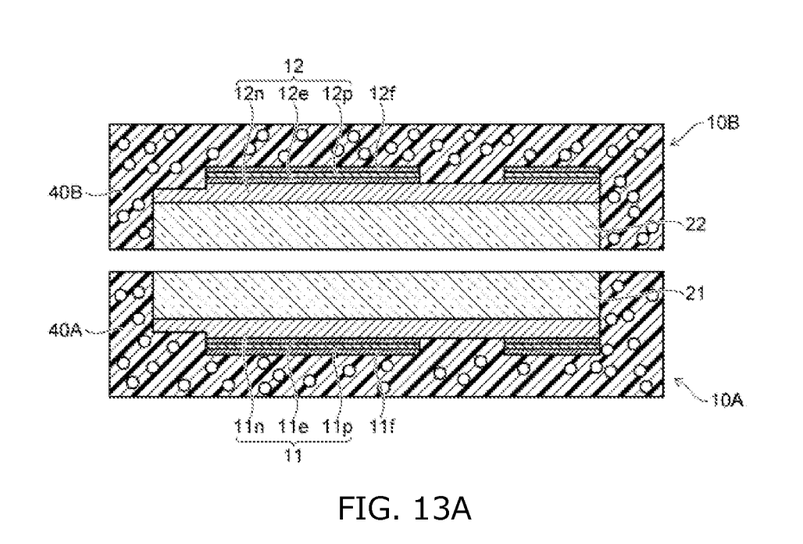
FIG. 13A is a schematic cross-sectional view illustrating the method of manufacturing a light emitting element according to the second embodiment.
Figure 13B:
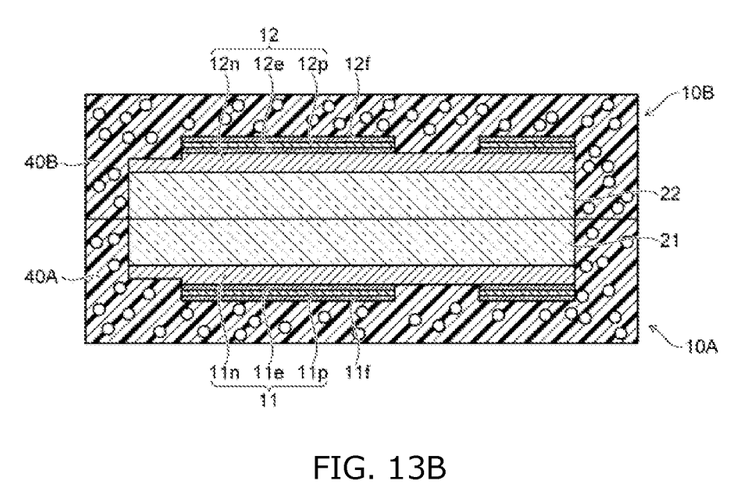
FIG. 13B is a schematic cross-sectional view illustrating the method of manufacturing a light emitting element according to the second embodiment.

FIGS. 13A and 13B are schematic cross-sectional views illustrating another method of manufacturing a light emitting element according to the second embodiment.

As shown in FIG. 13A, the first light emitting part 10A and the second light emitting part 10B are provided. The first light emitting part 10A includes the first base member 21, a first light reflecting member 40A, and the first semiconductor layered body 11 disposed between the first base member 21 and the first light reflecting member 40A. The first light reflecting member 40A covers surfaces of the first base member 21 except for a surface of the first base member 21 opposite to a surface of the first base member 21 provided with the first semiconductor layered body 11. The second light emitting part 10B includes the second base member 22, a second light reflecting member 40B, and the second semiconductor layered body 12 disposed between the second base member 22 and the second light reflecting member 40B. The second light reflecting member 40B covers surfaces of the second base member 22 except for a surface of the second base member 22 opposite to a surface of the second base member 22 provided with the second semiconductor layered body 12.

As shown in FIG. 13B, the first light emitting part 10A and the second light emitting part 10B are bonded to each other such that the first base member 21 and the second base member 22 are disposed between the first semiconductor layered body 11 and the second semiconductor layered body 12. In this bonding, the first base member 21 and the second base member are bonded to each other using direct bonding. A first light reflecting member 41 and a second light reflecting member 42 may be bonded to each other using direct bonding.

Thereafter, the step described above with reference to FIG. 11A is carried out. For example, the first n-side electrically conductive member 51nP, the first n-side electrode 51n, the second n-side electrically conductive member 52nP, the second n-side electrode 52n, the first p-side electrically conductive member 51pP, the first p-side electrode 51p, the second p-side electrically conductive member 52pP, and the second p-side electrode 52p are formed.

Thereafter, the steps described above with reference to FIGS. 11A and 11B are carried out. For example, a portion of the first light reflecting member 40A and a portion of the second light reflecting member 40B are removed to expose a surface of the first base member 21 and a surface of the second base member 22. The wavelength conversion member 30 is disposed on the exposed surface of the first base member 21 and the exposed surface of the second base member 22. The light emitting element 110 is obtained in this manner. According to the second embodiment, it is possible to provide a method of manufacturing a light emitting element that can emit light in a wide range of colors and in which light emitting characteristics can be improved.

Figure 14:
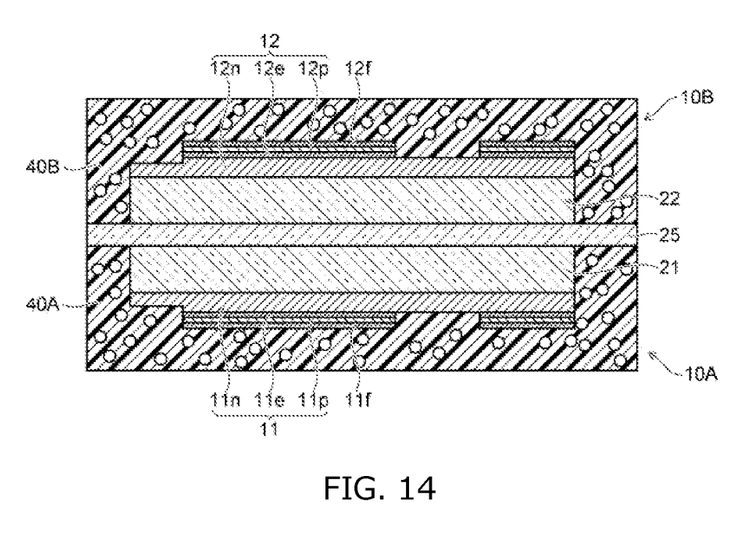
FIG. 14 is a schematic cross-sectional view illustrating the method of manufacturing a light emitting element according to the second embodiment.

FIG. 14 is a schematic cross-sectional view illustrating the method of manufacturing a light emitting element according to the second embodiment.

As shown in FIG. 14, the first light emitting part 10A including the first light reflecting member 40A, and the second light emitting part 10B including the second light reflecting member 40B are provided, and the intermediate layer 25 is then disposed between the first base member 21 and the second base member 22. For example, the first base member 21 and the second base member 22 are bonded with a resin that forms the intermediate layer 25.

Thereafter, the steps described above with reference to FIGS. 10C, 11A and 11B are carried out. In this manner, the light emitting element 111 is obtained. According to the second embodiment, it is possible to provide a method of manufacturing a light emitting element with which light in a wide range of colors can be obtained and light emitting characteristics can be improved.

For example, the light emitting element according to certain embodiments may be used for backlights or lighting systems. Certain embodiments allow for obtaining light in which colors are mixed well. Additionally, for example, a thin backlight can be obtained.

According to certain embodiments, a light emitting element with improved light emitting characteristics, a light emitting device; and a method of manufacturing a light emitting element can be obtained.

In the specification of the present application, the terms "perpendicular" and "parallel" encompass not only exactly perpendicular configuration and exactly parallel configurations but also configurations slightly deviated from an exactly perpendicular configuration and an exactly parallel configurations, respectively, due to manufacturing variations, etc. That is, the terms "perpendicular" and "parallel" encompass substantially perpendicular and substantially parallel configurations, respectively.

Certain embodiments of the present invention have been described above with reference to specific examples. However, the present disclosure is not limited to these specific examples. For example, specific configurations of each of the base member, the semiconductor layered body, the light reflecting member, the wavelength conversion member, and the electrodes in the light emitting element may be appropriately selected from those known by a person skilled in the art, and variations of such specific configurations are included in the scope of the present invention as long as a person skilled in the art can similarly implement the invention and similar effects can be obtained.

Technically feasible combinations of two or more elements of the specific examples are also within the scope of the present invention as long as the combination of elements is within the spirit of the present invention.

In addition, all light emitting elements and methods of manufacturing the light emitting elements that can be obtained by those skilled in the art with appropriate changes in design on the basis of the embodiments described above are within the scope of the present invention so long as they are within the spirit of the present invention.

In addition, those skilled in the art can arrive at various alterations and modifications in the field of the present invention, and these alterations and modifications should be construed to be within the scope of the present invention.

What is claimed is:

1. A method of manufacturing a light emitting element, the method comprising:

providing a first light emitting part and a second light emitting part, the first light emitting part comprising a first base member and a first semiconductor layered body, the second light emitting part comprising a second base member and a second semiconductor layered body;

bonding the first light emitting part and the second light emitting part to each other such that the first base member and the second base member are disposed between the first semiconductor layered body and the second semiconductor layered body;

disposing a light reflecting member to cover the bonded first light emitting part and second light emitting part;

removing a portion of the light reflecting member to expose a surface of the first base member and a surface of the second base member; and disposing a wavelength conversion member on the exposed surface of the first base member and the exposed surface of the second base member.

2. The method according to claim 1, wherein:
the light reflecting member comprises a first region and a second region,
the wavelength conversion member comprises a first portion, a second portion, and a third portion disposed between the first portion and the second portion in a first direction from the first region to the second region,
the wavelength conversion member faces the first base member and the second base member,
a portion of the first region is disposed between the first portion and a portion of the first semiconductor layered body in a second direction perpendicular to the first direction, and
a portion of the second region is disposed between the second portion and a portion of the second semiconductor layered body in the second direction.

3. The method according to claim 2, wherein:
the light reflecting member comprises a third region, a fourth region and a fifth region,
the first semiconductor layered body, the second semiconductor layered body, the first base member and the second base member are disposed between the third region and the fourth region in a third direction perpendicular to a plane extending along the first direction and the second direction, and
the first semiconductor layered body, the second semiconductor layered body, the first base member and the second base member are disposed between the wavelength conversion member and the fifth region in the second direction.

4. The method according to claim 1, wherein:
the first semiconductor layered body and the second semiconductor layered body comprise a nitride semiconductor, and
the first base member and the second base member comprise sapphire.

5. The method according to claim 2, wherein:
the first semiconductor layered body comprises:
 a first n-type semiconductor layer,
 a first p-type semiconductor layer disposed between the first n-type semiconductor layer and the first region, and
 a first light emitting layer disposed between the first n-type semiconductor layer and the first p-type semiconductor layer,
at least a portion of the first n-type semiconductor layer is in contact with the first portion, and the portion of the first region is disposed between the first portion and the first p-type semiconductor layer in the second direction.

6. The method according to claim 5, wherein the light-emitting element further comprises:
a first n-side electrode electrically connected to the first n-type semiconductor layer; and
a first p-side electrode electrically connected to the first p-type semiconductor layer,
wherein:
at least a portion of the first n-side electrode is exposed from the first region, and
at least a portion of the first p-side electrode is exposed from the first region.

7. The method according to claim 6, wherein:
the first region comprises a first end portion and a second end portion,
the second end portion is disposed between the first end portion and the first portion in the second direction,
the first n-side electrode comprises a first electrode end portion and a second electrode end portion,
the second electrode end portion is disposed between the first electrode end portion and the first portion in the second direction, and
the first electrode end portion and the first end portion are flush.

8. The method according to claim 7, wherein:
the first p-side electrode comprises a third electrode end portion and a fourth electrode end portion,
the fourth electrode end portion is disposed between the third electrode end portion and the first portion in the second direction, and
the third electrode end portion and the first end portion are flush.

9. The method according to claim 2, wherein:
the second semiconductor layered body comprises:
 a second n-type semiconductor layer,
 a second p-type semiconductor layer provided between the second n-type semiconductor layer and the second region, and
 a second light emitting layer provided between the second n-type semiconductor layer and the second p-type semiconductor layer,
at least a portion of the second n-type semiconductor layer is in contact with the second portion, and
the portion of the second region is disposed between the second portion and the second p-type semiconductor layer in the second direction.

10. The method according to claim 9, wherein the light-emitting element further comprises:
a second n-side electrode electrically connected to the second n-type semiconductor layer; and
a second p-side electrode electrically connected to the second p-type semiconductor layer,
wherein:
at least a portion of the second n-side electrode is exposed from the second region, and
at least a portion of the second p-side electrode is exposed from the second region.

11. A method of manufacturing a light emitting element, the method comprising:
providing a first light emitting part and a second light emitting part, wherein:
 the first light emitting part comprises a first base member, a first light reflecting member, and a first semiconductor layered body located between the first base member and the first light reflecting member, and the second light emitting part comprises a second base member, a second light reflecting member, and a second semiconductor layered body located between the second base member and the second light reflecting member;

bonding the first light emitting part and the second light emitting part to each other such that the first base member and the second base member are disposed between the first semiconductor layered body and the second semiconductor layered body;

removing a portion of the first light reflecting member and a portion of the second light reflecting member to expose a surface of the first base member and a surface of the second base member; and disposing a wavelength conversion member on the exposed surface of the first base member and the exposed surface of the second base member.

12. The method according to claim 11, wherein:
the wavelength conversion member comprises a first portion, a second portion, and a third portion disposed between the first portion and the second portion in a first direction from the first light reflecting member to the second light reflecting member,
the wavelength conversion member faces the first base member and the second base member,
a portion of the first light reflecting member is disposed between the first portion and a portion of the first semiconductor layered body in a second direction perpendicular to the first direction, and
a portion of the second light reflecting member is disposed between the second portion and a portion of the second semiconductor layered body in the second direction.

13. The method according to claim 12, wherein:
the first light reflecting member comprise a third region and a fifth region,
the second light reflecting member comprise a fourth region and a sixth region,
the first semiconductor layered body, the second semiconductor layered body, the first base member and the second base member are disposed between the third region and the fourth region in a third direction perpendicular to a plane extending along the first direction and the second direction, and
the first semiconductor layered body and the first base member are disposed between the wavelength conversion member and the fifth region in the second direction,
the second semiconductor layered body and the second base member are disposed between the wavelength conversion member and the six region in the second direction.

14. The method according to claim 11, wherein:
the first semiconductor layered body and the second semiconductor layered body comprise a nitride semiconductor, and
the first base member and the second base member comprise sapphire.

15. The method according to claim 12, wherein:
the first light reflecting member comprises a first region
the first semiconductor layered body comprises:
a first n-type semiconductor layer,
a first p-type semiconductor layer disposed between the first n-type semiconductor layer and the first region, and
a first light emitting layer disposed between the first n-type semiconductor layer and the first p-type semiconductor layer,
at least a portion of the first n-type semiconductor layer is in contact with the first portion, and
the portion of the first region is disposed between the first portion and the first p-type semiconductor layer in the second direction.

16. The method according to claim 15, the light-emitting element further comprising:
a first n-side electrode electrically connected to the first n-type semiconductor layer; and
a first p-side electrode electrically connected to the first p-type semiconductor layer, wherein:
at least a portion of the first n-side electrode is exposed from the first region, and
at least a portion of the first p-side electrode is exposed from the first region.

17. The method according to claim 16, wherein:
the first region comprises a first end portion and a second end portion,
the second end portion is disposed between the first end portion and the first portion in the second direction,
the first n-side electrode comprises a first electrode end portion and a second electrode end portion,
the second electrode end portion is disposed between the first electrode end portion and the first portion in the second direction, and
the first electrode end portion and the first end portion are flush.

18. The method according to claim 17, wherein:
the first p-side electrode comprises a third electrode end portion and a fourth electrode end portion,
the fourth electrode end portion is disposed between the third electrode end portion and the first portion in the second direction, and
the third electrode end portion and the first end portion are flush.

* * * * *